(12) United States Patent
Hoshi et al.

(10) Patent No.: US 6,639,454 B2
(45) Date of Patent: Oct. 28, 2003

(54) MULTIPLE CIRCUIT BLOCKS WITH INTERBLOCK CONTROL AND POWER CONSERVATION

(75) Inventors: Tadashi Hoshi, Higashimurayama (JP); Kenji Hirose, Tokorozawa (JP); Hideaki Abe, Higashiyamato (JP); Junichi Nishimoto, Hachioji (JP); Midori Nagayama, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/081,186

(22) Filed: Feb. 25, 2002

(65) Prior Publication Data

US 2003/0052730 A1 Mar. 20, 2003

(30) Foreign Application Priority Data

Sep. 19, 2001 (JP) .......................................... 2001-284383

(51) Int. Cl.[7] .................................................. G11C 5/14
(52) U.S. Cl. ......................... 327/544; 327/594; 365/227
(58) Field of Search ................................. 327/519, 544, 327/594; 307/29, 38, 80; 365/226, 227, 228

(56) References Cited

U.S. PATENT DOCUMENTS

| | | | | | |
|---|---|---|---|---|---|
| 5,343,437 | A | * | 8/1994 | Johnson et al. | 365/230.03 |
| 5,526,318 | A | * | 6/1996 | Slemmer et al. | 365/226 |
| 5,615,162 | A | * | 3/1997 | Houston | 365/226 |
| 5,627,492 | A | * | 5/1997 | Weaver et al. | 327/544 |
| 6,246,627 | B1 | * | 6/2001 | Yamauchi et al. | 365/228 |

* cited by examiner

*Primary Examiner*—Timothy P. Callahan
*Assistant Examiner*—Terry L. Englund

(57) ABSTRACT

A semiconductor integrated circuit is provided including a plurality of circuit blocks and adapted to cut off the supply of power source voltage to any one of the circuit blocks. The integrated circuit includes an interblock interface circuit provided on a signal path from the elected circuit block to other circuit blocks, wherein a single output of the interblock interface circuit is branched out to other circuit blocks. The interblock interface circuit includes a signal gate for preventing signal transmission to other circuit blocks and includes a storage unit for storing a signal right before the power cut.

7 Claims, 8 Drawing Sheets

MULTIPLE CIRCUIT BLOCKS WITH INTERBLOCK CONTROL AND POWER CONSERVATION

BACKGROUND OF THE INVENTION

The present invention relates in general to techniques for reducing power consumption of semiconductor integrated circuits. More particularly, the invention relates to techniques which are effectively utilized in semiconductor integrated circuits for processing data in which, for example, a CPU (Central Processing Unit) and its peripheral circuits are formed on one semiconductor chip, especially, in semiconductor integrated circuits for use in portable or mobile electronic devices which are operated by batteries or cells.

Heretofore, there is known a semiconductor IC (Integrated Circuit) such as a microcomputer adapted to stop a clock signal while supplying a power source voltage to the whole chip in a standby mode or the like to stop the operation of the circuits, thereby reducing the power consumption.

However, in such a system of reducing the power consumption on the basis of the stop of a clock signal, there is an inconvenience that since the operation of the circuits is stopped while supplying the power source voltage to the chip, if a leakage current occurs in a MOS FET and the like constituting the circuits, this results in that the power consumption is not sufficiently reduced. On the other hand, some of the semiconductor ICs are adapted in such a way that a part of the circuits in the inside of the chip is not operated, but other circuits are wanted to be operated. In such a case, it is conceivable that the supply of the power source voltage is cut off for any of the circuits which does not need to be operated.

While the reduction of the power consumption is possible in the case where the inside of the chip is divided into a plurality of circuit blocks and the supply of the power source voltage to any of the circuit blocks which does not need to be operated is cut off, the states of the signals outputted from the circuit blocks for which the supply of the power source voltage is cut off become indefinite or indeterminate. For this reason, if each of the circuit blocks on the side of receiving such signals is being operated, there is the possibility that the malfunction of such circuits may occur.

Then, the present inventors have investgated with respect to such a system wherein an interface circuit is provided in each of circuit blocks and a signal inputted from a circuit block is cut off at the interface circuit, to which circuit block the supply of the power source voltage has been cut off.

However, in the above system, it is necessary to change the design of the circuit blocks for which the interface circuits are needed to be provided, respectively, and also this change needs to be carried out on the basis of taking the states of other circuit blocks into consideration. Therefore, the design thereof becomes very complicated. In addition, it has become clear that since it is necessary to add the interface circuit for each signal supplied from the circuit block to which the supply of the power source voltage is cut off, there is the inconvenience that the circuit area is increased to increase the chip size.

SUMMARY OF THE INVENTION

In the light of the foregoing, the present invention has been made in order to solve the above-mentioned problems associated with the prior art, and it is therefore an object of the present invention to provide the semiconductor integrated circuit technique which is capable of cutting off the supply of the power source voltage to a part or portion of circuits to reduce the power consumption while preventing the malfunction of any of the circuits.

It is another object of the present invention to provide the semiconductor integrated circuit technique which is capable of reducing the power consumption while suppressing the increase in a circuit area.

It is still another object of the present invention to provide the semiconductor integrated circuit technique which is capable of reducing the power consumption by the small scale addition of a circuit(s).

The outline of aspects of the inventions disclosed in the present specification is given as follows.

That is, the inside of a chip is divided into a plurality of circuit blocks and at least any one of the plurality of circuit blocks is configured in such a way that it is possible that the supply of the power source voltage thereto is cut off to stop the operation thereof, and an interblock interface circuit (hereinafter, referred to as "an interface circuit" for short, when applicable) including a signal gate unit for being able to cut off the transmission of a signal and a storage unit for being able to store therein information of the state of a signal right before cutting off the supply of the power source voltage is provided between the at least any one of the plurality of circuit blocks the operation of which can be stopped and each of other circuit blocks. By the way, it is preferable that the above-mentioned interface circuit is provided on a path of a signal outputted from the at least any one of the plurality of circuit blocks the operation of which can be stopped to each of other circuit blocks and in the front of the position where the signal is branched.

By adopting the above-mentioned measure, since the supply of the power source voltage to a part of the circuit blocks can be cut off with the signal right before cutting off the supply of the power source voltage, it is possible to reduce the power consumption while preventing the malfunction of any of the circuit blocks on the side of receiving the signal. In addition, since the interface circuit is not provided in any of the circuit blocks on the side of receiving the signal, but is provided between the circuit blocks, it is unnecessary to change any of the circuit blocks and also it is possible to reduce the power consumption on the basis of the relatively small scale addition and change of a circuit(s).

Furthermore, if the interface circuit is provided in an input unit of each of the circuit blocks on the side of receiving the signal sent from the at least any one of the circuit blocks to which the supply of the power source voltage is cut off to stop the operation thereof, when the number of fan-outs of the signal of interest is large, it is necessary to provide the interface circuits the number of which is equal to the number of fan-outs. However, the interface circuit is provided on the path of the signal outputted from the at least any one of the circuit blocks to which the supply of the power source voltage can be cut off to other circuit blocks and in the front of the position where the signal is branched, whereby it is possible to suppress the number of interface circuits to a minimum, which results in that it is possible to reduce the power consumption while suppressing the increase in circuit area.

Also, preferably, a comparison circuit for comparing the signal stored in the storage unit with the signal which after resuming the supply of the power source voltage to the at least any one of the circuit blocks to which the supply of the power source voltage is continued to be cut off up to this time is outputted from the at least any one of the circuit blocks is provided in the above-mentioned interface circuit. As a result, when resuming the supply of the power source voltage to the at least any one of the circuit blocks to which the supply of the power source voltage is continued to be cut off up to this time, after confirming that the at least any one of the circuit blocks has could be restored to its former state, the state of the signal gate unit provided in the interface circuit is made the state of being able to transmit the signal, whereby it is possible to avoid the malfunction of the at least any one of the circuit blocks after reverting the supply of the power source voltage thereto.

The above and other objects, advantages and novel features of the present invention will be seen from the following description taken in connection with the accompanying drawings.

DESCRIPTION OF THE EMBODIMENTS

The embodiments of the present invention will hereinafter be described in detail with reference to the accompanying drawings.

Figure 1:
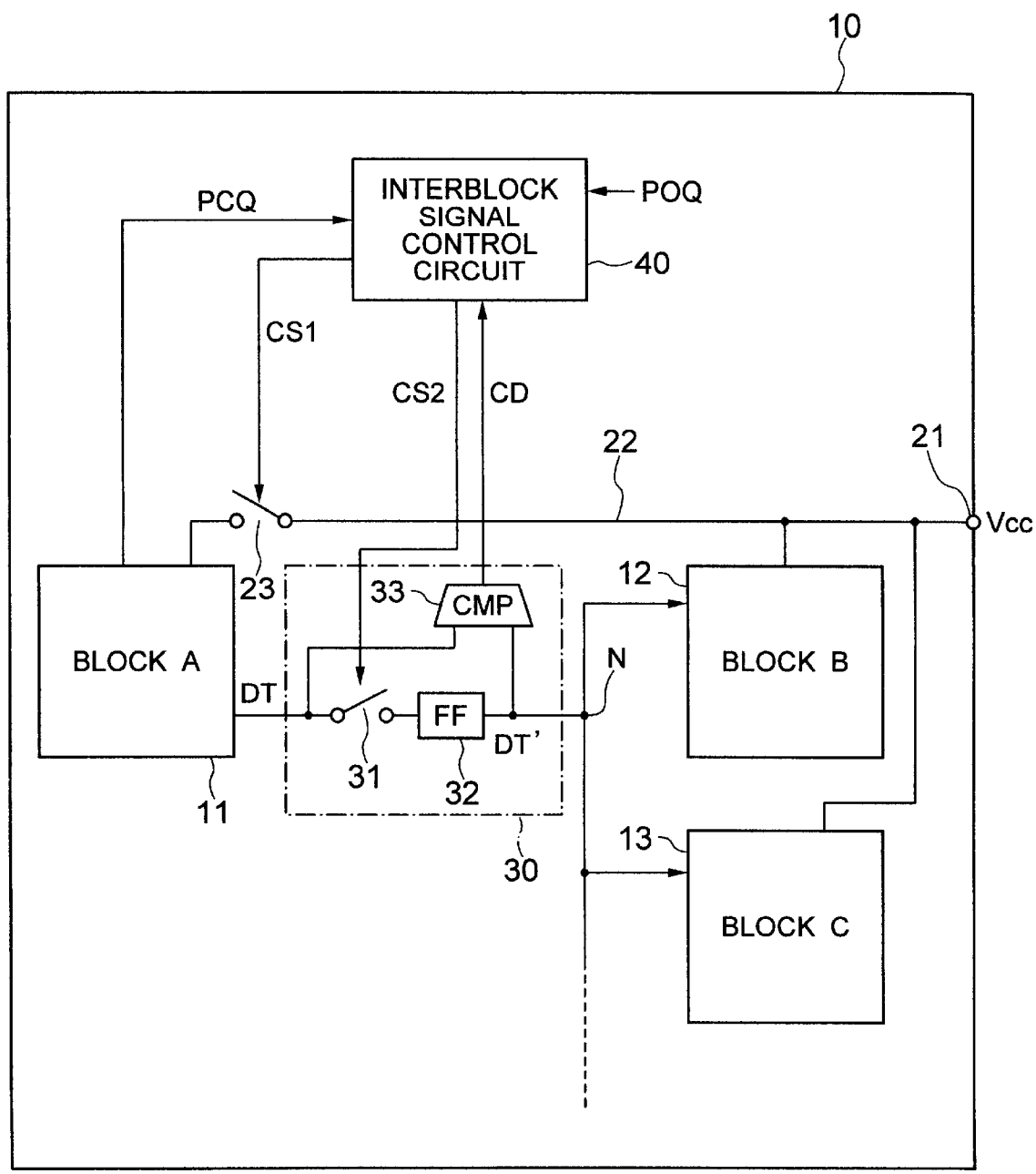
FIG. 1 is a block diagram, partly in circuit diagram, showing schematically a configuration of a first embodiment of a semiconductor IC to which the present invention is applied.

FIG. 1 is a block diagram, partly in circuit diagram, showing schematically a configuration of a first embodiment of a semiconductor IC (Integrated Circuit) to which the present invention is applied. In FIG. 1, reference numeral 10 designates one semiconductor chip made of monocrystalline silicon for example. As shown in FIG. 1, in the semiconductor IC of the first embodiment, the inside of the chip 10 is divided into a plurality of circuit blocks 11, 12, 13, . . . In the present embodiment, of these circuit blocks, the circuit block 11 is the circuit block the operation of which can be stopped.

Reference numeral 21 designates an external power source terminal to which a power source voltage Vcc supplied from the outside is applied. A switch 23 which is adapted to cut off the supply of the power source voltage is provided on a power source line 22 through which the power source voltage from the power source terminal 21 is supplied to the circuit block 11. In addition, an interface circuit 30 is provided on a path of a signal DT outputted from the circuit block 11 to each of other circuit blocks 12, 13, . . . and also before or in the front of the position of a branch point N of the signal. While in FIG. 1, there is illustrated an example in which the wiring is branched, alternatively, a configuration may also be adopted in which a buffer, a logic gate or the like having a plurality of fan-outs is arranged in the branch point N to branch the signal.

In addition, in general, in the semiconductor IC, there is the case where the branching of the signal is not carried out only at one position, but is carried out in the form of the so-called tree structure in which the branching of the signal is ramified progressively or gradually. In such a case, the interface circuits 30s may also be provided between the second stage and the third stage. But, it is most desirable in terms of the number that the interface circuits 30s are provided in the front of the position of the branching point near the circuit block 11 on the output side.

By the way, while only one interface circuit is shown in FIG. 1, the same interface circuits 30s are also provided on the paths of other signals (not shown) which are respectively outputted from the circuit block 11 to other circuit blocks 12, 13, . . . In addition, in the present embodiment, while not particularly limited, an interblock signal control circuit 40 for generating control signals CS1 and CS2 used to turn OFF the above-mentioned power source switch 23 in response to a power source cutoff request signal PCQ made from the circuit block 11 and to control the interface circuit 30 is formed on the same chip.

The interface circuit 30 includes a signal gate unit 31, such as a switch constituted by a MOS FET for example or a logic gate, for making possible the transmission of a signal or interrupting the transmission signal, a storage unit 32 for being able to store therein the information of the state (High level or Low level) of a signal right before cutting off the supply of the power source voltage, a signal comparison circuit 33 for comparing a data signal DT' stored in the storage unit 32 with a data signal DT outputted from the circuit block, to which the supply of the power source voltage is continued to be cut off up to this time, after resuming the supply of the power source voltage, and the like. A comparison result signal CD of the signal comparison circuit 33 is supplied to the above-mentioned interblock signal control circuit 40. The above-mentioned storage unit 32 may be constituted by a flip-flop and the like, and the above-mentioned signal comparison circuit 33 may be constituted by an exclusive NOR gate and the like.

According to the present embodiment, since the supply of the power source voltage to a part of the circuit blocks can be cut off with the signal right before cutting off the supply of the power source voltage being stored, the stored signal is continued to be supplied after the cutoff of the supply of the power source voltage. For this reason, it is possible to reduce the power consumption while preventing the malfunction of the circuit blocks 12, 13, . . . on the side of receiving a signal. In addition, according to the present embodiment, as shown in FIG. 1, the interface circuit 30 is provided on the side near an output terminal of the circuit block 11 to which the supply of the power source voltage is cut off. That is, since when the signal outputted from the circuit block 11 is supplied to a plurality of circuit blocks, the interface circuit 30 is provided in the front of the position of a branch point N at which that signal is branched, it is possible to reduce the number of circuits as compared with the case where the interface circuits are provided in the inlet ports of the circuit blocks each receiving the signal, respectively.

Next, the description will hereinbelow be given with respect to the procedure of the operation of cutting off and restoring the supply of the power source voltage to the circuit block 11 in the semiconductor IC of the present embodiment shown in FIG. 1 with reference to a flow chart of FIG. 2 and a timing chart of FIGS. 3 and 4.

If when carrying out the normal operation, for example, the operation stop mode or the like occurs in the circuit block 11 (Step S1), the value in a register within the circuit block 11 is transferred to a memory provided in the outside of the chip for example to be stored therein (Step S2). By the way, if a memory is provided in other circuit block 12 or 13, the value in the register within the circuit block 11 may be saved therein. In this case, it is assumed that the interface circuit 30 as described above is not provided on the signal path.

Figure 2:
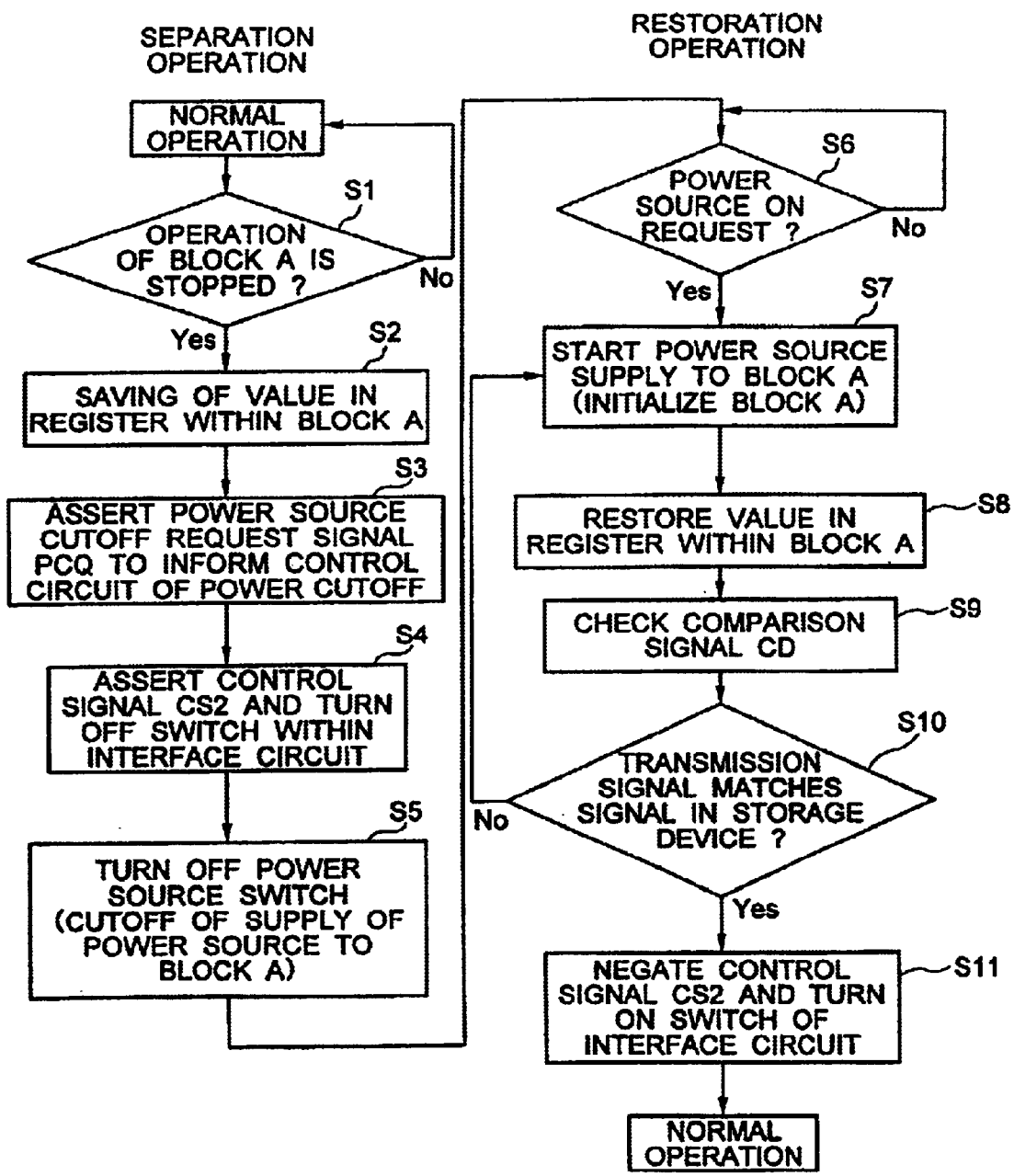
FIG. 2 is a flow chart useful in explaining the procedure of the operation of cutting off the supply of the power source voltage to a portion of circuit blocks and of restoring the supply of the power source voltage in the semiconductor IC of the first embodiment.
Figure 3:
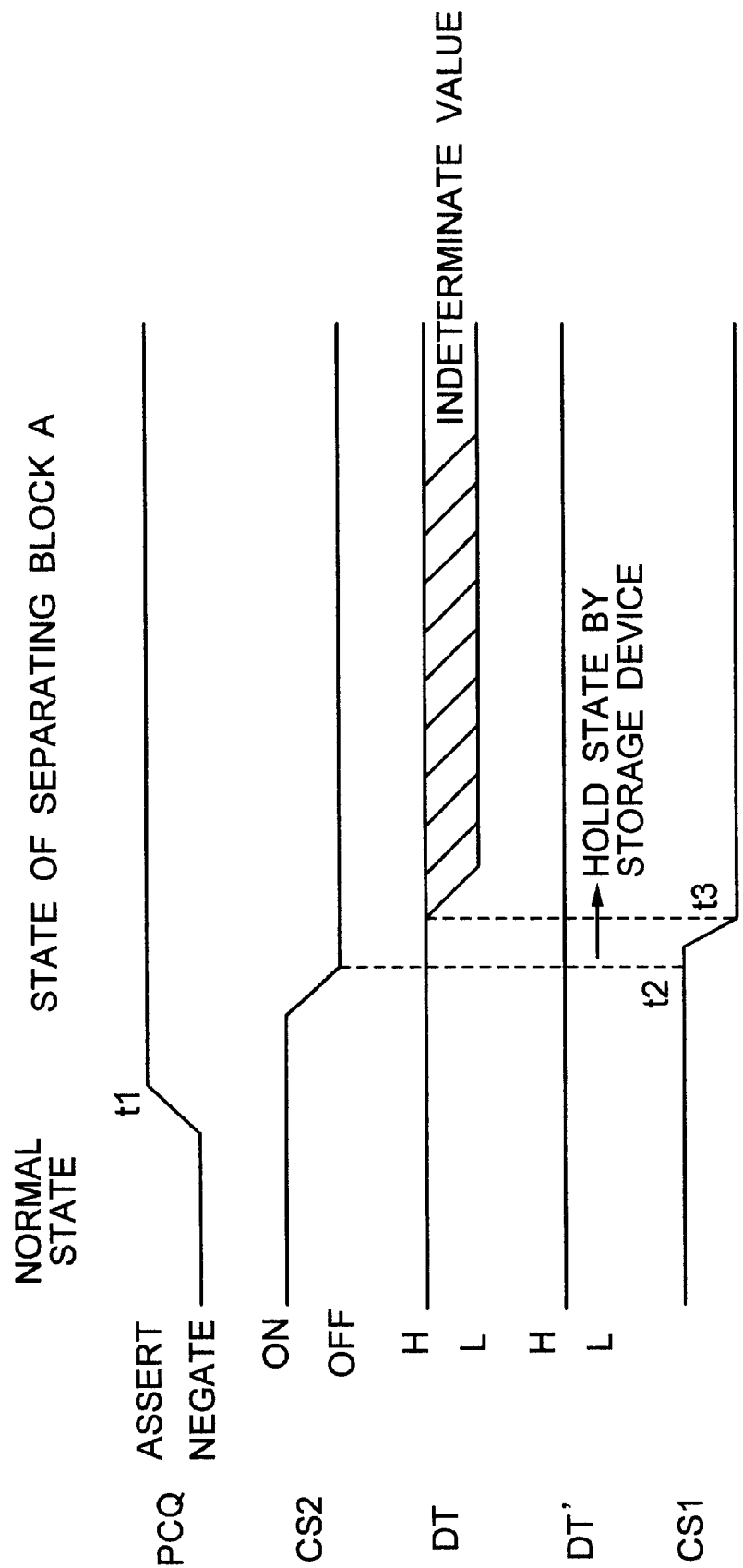
FIG. 3 is a timing chart useful in explaining the timing of the associated signals when cutting off the supply of the power source voltage to a part of the circuit blocks in the semiconductor IC of the first embodiment.

Thereafter, the circuit block 11 asserts the power source cutoff request signal PCQ to become the High level for example to inform the interblock signal control circuit 40 of the cutoff of the power source (Step S3 in FIG. 2 and timing t1 in FIG. 3). Then, the interblock signal control circuit 40 changes a control signal CS2 into the Low level for example to change the state of a signal gate unit 31 within the interface circuit 30 into the cutoff state (Step S4 in FIG. 2 and timing t2 in FIG. 3).

At the time when the state of the signal gate unit 31 is made the cutoff state, the information of the state, right before the cutoff of the supply of the power source voltage, of a signal DT outputted from the circuit block 11 is stored in the storage unit 32. Subsequently, the interblock signal control circuit 40 changes a control signal CS1 to turn OFF the power source switch 23 (Step S5 in FIG. 2 and timing t3 in FIG. 3).

Above, the control in the cutoff of the power source has been described. While the state of the data signal outputted from the circuit block 11 becomes indefinite or indeterminate under this control, since the data signal DT is stored in the storage unit 32 before the indefinite state and is also continued to be supplied after the cutoff of the power source, other circuit blocks 12, 13 and the like each receiving the data signal DT' do not cause the malfunction at all.

A power source charge (power ON) request signal POQ of the circuit block 11 to the interblock signal control circuit 40 is asserted, whereby the restoration of the supply of the power source voltage is started (Step S6). This power source charge request signal POQ is sometimes inputted from the outside of the chip, and is otherwise inputted from other circuit blocks 12, 13 and the like. At the time when the power source charge request signal POQ is asserted, the interblock signal control circuit 40 changes the level of the control signal CS1 into the High level to turn ON the power source switch 23, thereby supplying the power source voltage Vcc to the circuit block 11 (Step S7 in FIG. 2 and timing t4 in FIG. 4).

Then, in the circuit block 11, the initialization of the register and the like in the inside thereof is carried out.

Subsequently, the circuit block 11 returns the value in the register saved in the memory provided in the outside of the chip (or the memory in other circuit block 12 or 13) back to the original register (Step S8). As a result, the state of the data signal DT outputted from the circuit block 11 right before the cutoff of the power source is restored into its former state. In addition, the power source cutoff request signal PCQ to the interblock signal control circuit 40 becomes the state of being negated into the Low level.

Thereafter, the interblock signal control circuit 40 checks a comparison result signal CD sent from the comparison circuit 33 in the interface circuit 30 to judge whether or not the state of the data signal DT outputted from the circuit block 11 is identical to that of the data signal DT' stored in the storage unit 32. If it is judged that the state of the data signal DT outputted from the circuit block 11 is not identical to that of the data signal DT' stored in the storage unit 32, then the process is returned back to Step S7 to initialize the circuit block 11 again or to execute a predetermined error processing (Steps S9 and S10).

Figure 4:
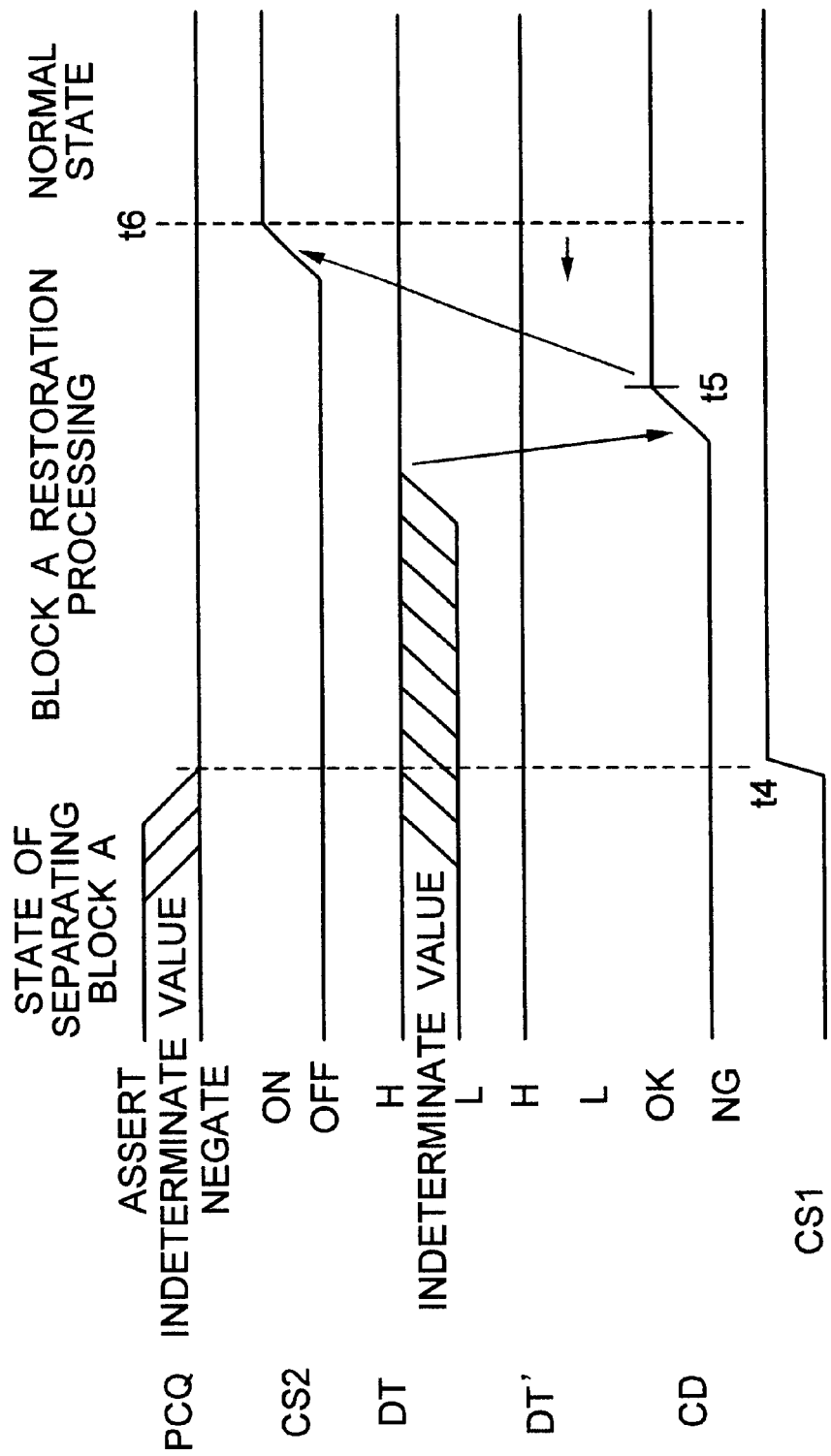
FIG. 4 is a timing chart useful in explaining the timing of the associated signals when reverting the supply of the power source voltage to a part of the circuit diagrams in the semiconductor IC of the first embodiment.
Figure 6:
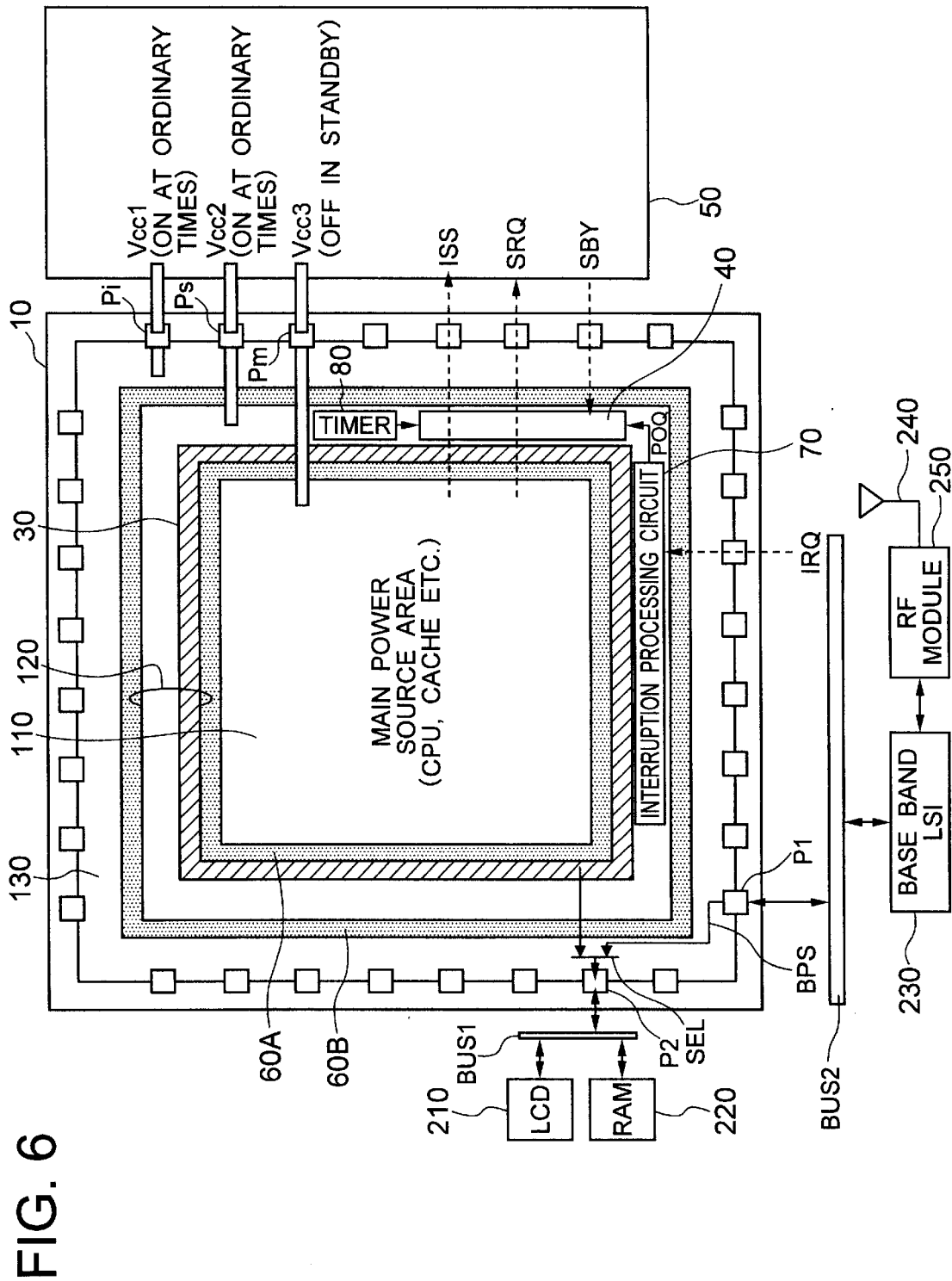
FIG. 6 is a block diagram, partly in circuit diagram, showing schematically a configuration of a third embodiment of a semiconductor IC to which the present invention is applied and showing an example of a configuration of a portable or mobile telephone system employing the same as a controller.

On the other hand, if it is judged in Step S10 that the state of the data signal DT outputted from the circuit block 11 is identical to that of the data signal DT' stored in the storage unit 32, since the level of the comparison result signal CD is changed into the High level as shown at timing t5 in FIG. 4, in response thereto, the interblock signal control circuit 40 changes the level of the control signal CS2 into the High level to turn ON the signal gate unit 31 in the interface circuit 30 (Step S11 in FIG. 2 and timing t6 in FIG. 6). As a result, the circuit block 11 is connected to other circuit blocks 12, 13, . . . so that the operation of the chip is returned back to the normal operation.

While above, the description has been given with respect to the first embodiment in which the interblock signal control circuit 40 controls the cutoff of the supply of the power source voltage to the circuit block 11, the present invention can also be applied to an embodiment in which the power source voltage to the circuit block 11 is supplied from the outside separately from other circuit blocks, and the cutoff of the supply of the power source voltage to the circuit block 11 is carried out in the outside.

Figure 5:
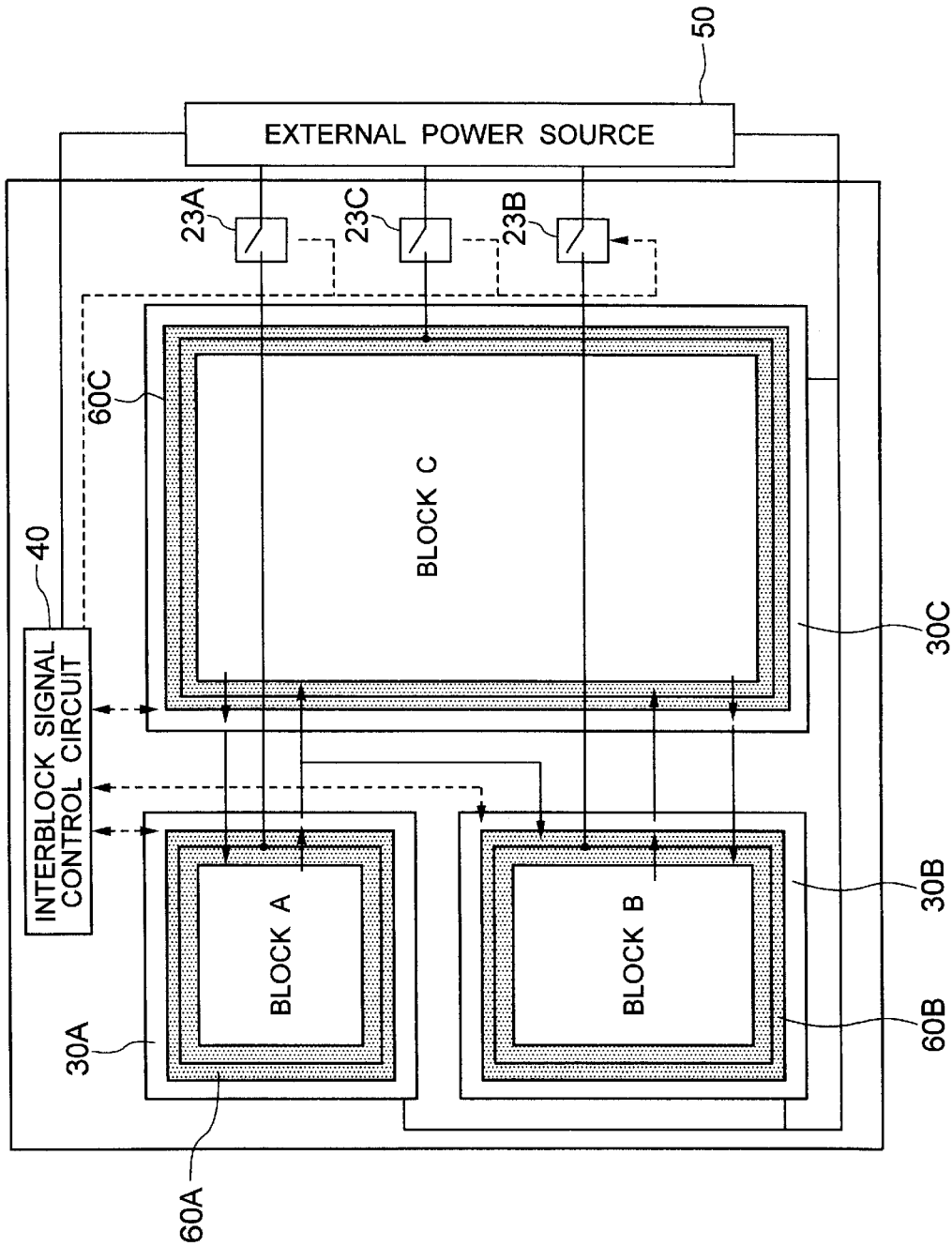
FIG. 5 is a block diagram, partly in circuit diagram, showing schematically a configuration of a second embodiment of a semiconductor IC to which the present invention is applied.

Next, a second embodiment of the present invention will hereinbelow be described with reference to FIG. 5. In FIG. 5, the same circuits and portions as those in FIG. 1 are designated with the same reference numerals, and the repeated description is omitted here for the sake of simplicity. In the figure, reference numeral 50 designates an external power source device.

The second embodiment is such that power source switches 23A, 23B and 23C are provided to be able to cut off the supply of the power source voltages to a plurality of circuit blocks 11, 12, and 13 on a semiconductor chip 10, respectively. While not particularly limited, power source line areas 60A, 60B and 60C having power source lines distributed therein are respectively provided in the peripheries of the circuit blocks 11, 12 and 13, and interface areas 30A, 30B and 30C in each of which a plurality of interface circuits 30s each shown in FIG. 1 are respectively provided in the outside of the power source line areas 60A, 60B and 60C.

In such a way, the interface areas 30A, 30B and 30C are respectively provided in the outside of the power source line areas 60A, 60B and 60C, and also elements constituting the interface circuit of each of the interface areas 30A, 30B and 30C, and elements constituting the corresponding circuit blocks 11, 12 and 13 are formed in well regions, in the chip surface, which are electrically separated from each other. Therefore, with respect to the circuit block to which the supply of the power source voltage is cut off, the supply of the electric potential to its well region can also be cut off, whereby it is possible to reduce the power consumption.

The interface circuits which are provided in each of the above-mentioned interface circuits 30A, 30B and 30C are configured so that the signals outputted from the corresponding circuit blocks 11, 12 and 13 are interrupted or stored and that the signals inputted from other circuit blocks are directly passed there-through as they are. While in FIG. 5, the interface areas 30A, 30B and 30C are provided in such a way as to enclose or surround the circuit blocks 11, 12 and 13, respectively, alternatively, the interface areas 30A, 30B and 30C may also be provided along one side of the circuit blocks 11, 12 and 13, respectively.

While in the present embodiment, the supply of the power source voltages to the circuit blocks 11, 12 and 13 can be cut off by the power source switches 23A, 23B and 23C, respectively, the semiconductor IC of the present embodiment is configured in such a way that the power source voltages are supplied from the external power source device 50 to the interface circuits of the interface areas 30A, 30B and 30C and the interblock signal control circuit 40 at all times, respectively. The interblock signal control circuit 40, similarly to the first embodiment, controls the interface circuits and the power source switches 23A, 23B and 23C.

According to the present embodiment, since the supply of the power source voltage to any one of the circuit blocks can be arbitrarily cut off with the signal thereof right before the cutoff of the supply of the power source voltage being stored, it is possible to reduce the power consumption while preventing the malfunction of other circuit blocks. In addition, the configuration may also be made in such a way as to cut off the supply of the power source voltages to two circuit blocks.

Next, the description will hereinbelow be given with respect to an embodiment in the case where the present invention is applied to a microprocessor, and an example of a system of a portable telephone in which this microprocessor is employed as a controller with reference to FIG. 6.

In the present embodiment, while not particularly limited, a main power source area 110 is located in the central part of a semiconductor chip 10, and the circuits, such as a CPU (Central Processing Unit) and a cache memory, for which the supply of the power source voltage is cut off in the standby mode are provided in the main power source area 110. In addition, a sub-power source area 120 is provided in the periphery of the main power source area 110, and the circuits similar to the interface circuits 30s shown in FIG. 1, the circuit similar to the interblock signal control circuit 40, an interruption processing circuit 70 as the peripheral circuit of the CPU, a timer circuit 80 and the like are provided in the sub-power source area 120. The power source voltages are supplied to these circuits at all times.

By the way, in the present embodiment, the interface circuit 30 of the circuits provided in the sub-power source area 120 is arranged in the innermost part of the sub-power source area 120 (i.e., in the part nearer the center of the chip) in such a way as to enclose the main power source area 110 (CPU core part). In addition, while not particularly limited, a power source line area 60A and a power source line area 60B are provided between the main power source area 110 and the sub-power source area 120 and between the sub-power source area 120 and an I/O power source area 130, respectively, and also the well regions, in the substrate surface, of the main power source area 110 and the sub-power source area 120 are electrically separated from each other.

In addition, in the present embodiment, the I/O power source area 130 is provided in the peripheral part of the chip located in the outside of the above-mentioned sub-power source area 120, and also an I/O circuit connected to the pad, which is used in the input/output of the signal, of the pads as the external terminals of the chip is arranged in the I/O power source area 130. Then, three power source pads Pi, Ps and Pm are provided in the semiconductor chip of the present embodiment in correspondence to the I/O power source area 130, the sub-power source area 120 and the main power source area 110, and the power source voltage Vcc such as 3.3 V which is higher than the power source voltage for the internal circuit is supplied to the I/O power source area 130 through the power source pad Pi for I/O. This configuration is adopted for the purpose of making it possible to carry out the exchange of the information between this semiconductor chip and other apparatus located in the outside of the chip through the signal having a larger amplitude than that in the inside of the chip. On the other hand, the power source voltages Vcc2 and Vcc3 such as 1.5 V are respectively supplied to the sub-power source area 120 and the main power source area 110 in order to suppress the power consumption in the internal circuit.

In the present embodiment, the semiconductor chip is configured in such a way that an internal state signal ISS is outputted from the CPU in the main power source area 110 to the power source device 50 in the outside of the chip, and if this internal state signal ISS exhibits that the state of being able to cut off the power source has been obtained, then the external power source device 50 supplies a standby signal SBY to the interblock signal control circuit 40 to make the circuit 40 cut off the supply of the power source voltage to the interface circuit and then the supply of the power source voltage to the main power source area 110 is cut off.

In addition, if a predetermined interruption signal IRQ is inputted from the outside of the chip to the interruption processing circuit 70 in the sub-power source area 120 in this state of cutting off the power source, then the interruption processing circuit 70 supplies a power source restoration request signal POQ to the interblock signal control circuit 40. Then, the interruption signal control circuit 40 outputs a standby release request signal to the external power source device 50. In response to this standby release request signal, the external power source device 50 resumes the supply of the power source voltage to the main power source area 110. Then, after the CPU initializes the internal circuit, the operation is resumed. On the other hand, the interblock signal control circuit 40 carries out the power conduction control of the interface circuit 30 after checking the completion of the initialization made by the CPU.

While not particularly limited, in the case where the microprocessor of the present embodiment is used in a portable or mobile telephone unit, the chip is connected to two buses BUS1 and BUS2. A liquid crystal display panel 210 and a RAM (Random Access Memory) 220 as a storage device are connected to one bus BUS1. In addition, an LSI 230 for the base band processing is connected to the other bus BUS2, and also a high frequency module 250 for processing a high frequency signal is connected between the base band LSI 230 and an antenna 240.

Furthermore, in order that the display on the liquid crystal display panel 210 may be directly switched to change by the signal from the LSI 230 for the base band processing without through the CPU while the supply of the power source voltage to the CPU is cut off to provide the state of stopping the operation, a bypass line BPS through which the external signal inputted to a certain pad P1 is outputted to the outside of the chip via other pad P2 as it is and a selector SEL for selecting one of the signal on the bypass line and the signal from the CPU for signal exchange therebetween are provided in the microprocessor chip of the present embodiment. The exchange made by the selector SEL may be carried out using the signal with which the interblock signal control circuit 40 cuts off the supply of the power source voltage to the interface circuit 30.

Figure 7:
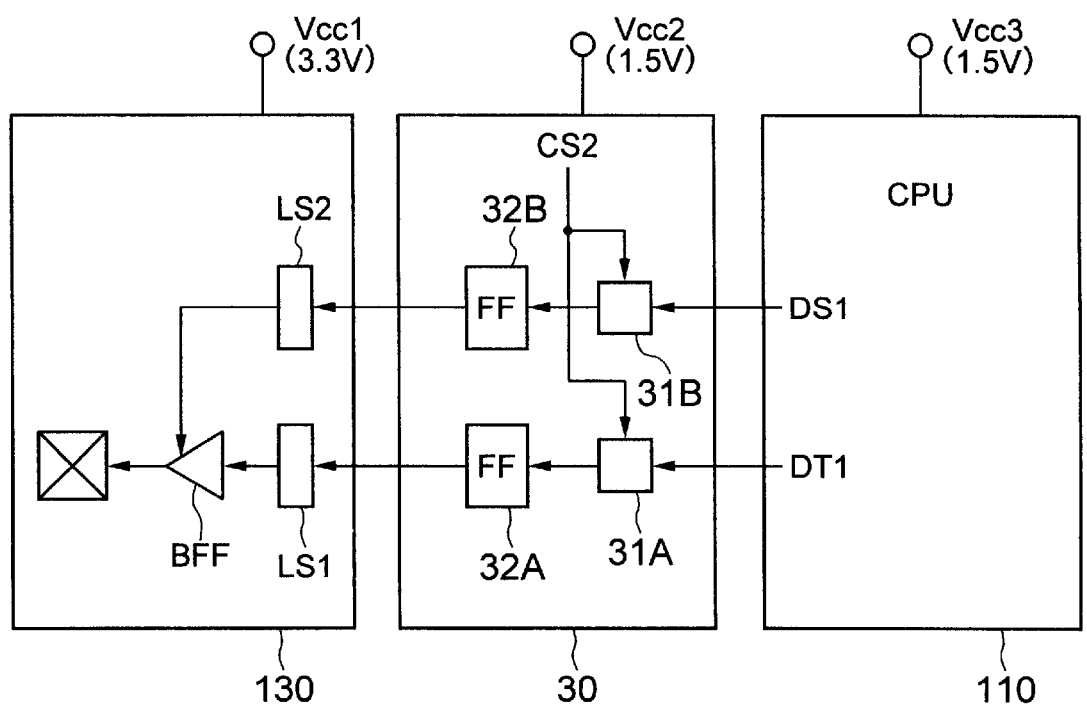
FIG. 7 is a block diagram showing one example of a relationship between an interface circuit and an I/O circuit of an I/O part in the third embodiment.

FIG. 7 shows a block diagram useful in explaining the method of treating or processing the signal, as an example of the interblock signal of the present invention in the microprocessor of the above-mentioned embodiment, outputted from the CPU core part in the main power source area 110 to the outside of the chip through the I/O circuit of the I/O power source area 130.

As shown in FIG. 7, when a data signal DT1 and an output control signal DS1 therefor are outputted from the CPU, the data signal DT1 and the output control signal DS1 are temporarily stored in storage units 32A and 32B through the signal gate units 31A and 31B of the interface circuit 30, respectively. The I/O circuit in the I/O power source area 130 is constituted by an I/O buffer and a level conversion circuit for example, and the data signal DT1 is supplied from the storage unit 32A to a level conversion circuit LS1 in which the amplitude thereof such as 0–1.5 V is in turn converted into the amplitude such as 0–3.3 V, so that the data signal DT1 is supplied to a data input terminal of an output buffer BFF. On the other hand, the output control signal DS1 is supplied from the storage unit 32B to a level conversion circuit LS2 in which the amplitude thereof such as 0–1.5 V is in turn converted into the amplitude such as 0–3.3 V, so that the output control signal DS1 is supplied to a control terminal of the output buffer BFF.

If the semiconductor chip is configured in such a way that no interface circuit 30 is provided, and the signals from the CPU are directly supplied to the level conversion circuits LS1 and LS2 to be outputted therefrom, then there is the possibility that the power source of the CPU is cut off, whereby the output signal of the output buffer BFF becomes indefinite or indeterminate. However, as in the present embodiment, the interface circuit 30 is provided and the statuses of the signals right before the cutoff of the power source are held by the storage units 32A and 32B, whereby it is possible to prevent the signal outputted to the outside of the chip from becoming indeterminate, and also it is possible to avoid that the malfunction is caused in not only other chips but also in the whole system.

Figure 8:
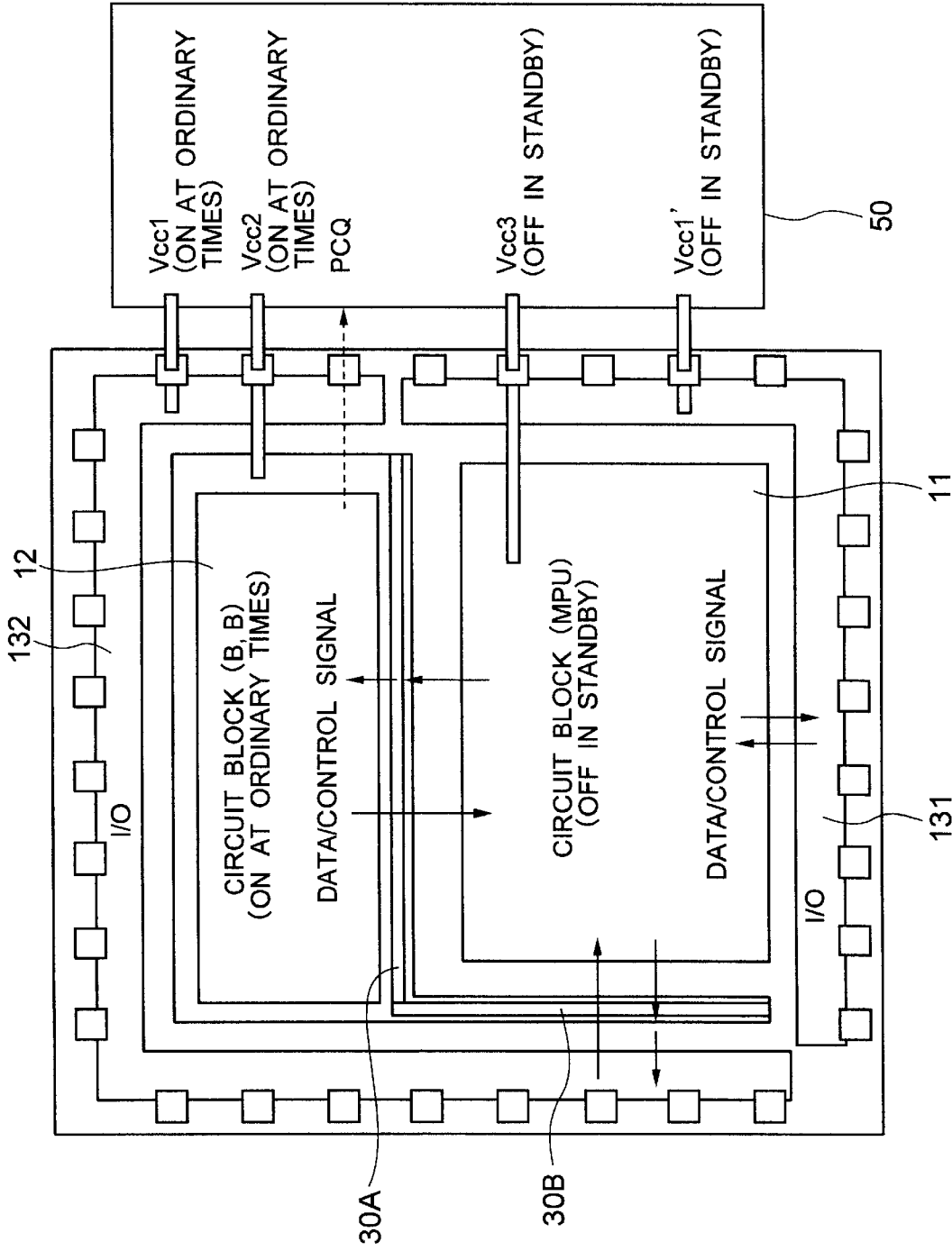
FIG. 8 is a block diagram, partly in circuit diagram, showing schematically a configuration of a fourth embodiment of a semiconductor IC to which the present invention is applied.

FIG. 8 shows a configuration of a fourth embodiment of a semiconductor IC to which the present invention is applied.

The present embodiment of the semiconductor IC is configured in such a way that when the internal circuit has the circuit block 11 for which the supply of the power source voltage is cut off in accordance with the operation mode and the circuit block 12 which has the power source voltage supplied thereto at all times to be operated, an I/O circuit is divided into an I/O part 131 in which the supply of the power source voltage is cut off in correspondence to the circuit blocks and an I/O part 132 which has the power source voltage supplied thereto at all times to be operated. An interface area 30A in which a plurality of interface circuits 30 as shown in FIG. 1 are arranged is formed between the circuit block 11 and the circuit block 12.

In addition, the present embodiment of the semiconductor IC is also configured in such a way that the signal(s), which does(do) not need to be outputted during the cutoff of the power source, of the signals outputted from the circuit block 11 for which the supply of the power source voltage is cut off in accordance with the operation mode is(are) supplied to the I/O part 131 for which the supply of the power source voltage is cut off, and also the signal(s) which is(are) wanted to be outputted even during the cutoff of the power source is(are) supplied to the I/O part 132 which has the supply of the power source voltage supplied thereto at all times to be operated through the interface area 30B in which a plurality of interface circuits 30 are arranged.

By the way, the interblock signal control circuit 40 for controlling the interface circuits 30s in the above-mentioned interface areas 30A and 30B is provided in a part of the circuit block 12 to which the power source voltage is supplied at all times. As for the semiconductor IC having such a configuration, for example, there is conceivable one which is configured in such a way that the microprocessor and the LSI 230 for the base band processing shown in FIG. 6 are integrated into one chip to operate/stop the microprocessor.

In this connection, in the present embodiment as well, the cutoff of the supply of the power source voltage to the circuit block 11 is carried out in the external power source device 50. For this reason, while the present embodiment is configured in such a way as to output the power source control signal PCQ from the circuit block 12 to the external power source device 50, similarly to the first embodiment shown in FIG. 1, the present embodiment may also be configured in such a way that the power source switch 23 is provided in the inside of the chip and the power source is cut off in the inside.

While above, the invention made by the present inventors has been described concretely on the basis of the embodiments, it is to be understood that the various changes will occur to those skilled in the art without departing from the subject matter of the invention. For example, it is also possible to configure a test circuit such that the storage units 32s in the interface circuits 30s in the above-mentioned embodiments are chain-coupled to enable a scan path acting as a shift register to be formed, and then in the test, the circuit blocks are operated after inputting the test data from the outside of the chip to the inside of the LSI using the scan path, and the output signal(s) which has(have) been changed through the logic operation in the associated one(s) of the circuit blocks is(are) stored in the associated one(s) of the storage units 32s in the interface circuits 30s to operate the scan path as the shift register again to output the output signal(s) to the outside of the chip.

While the above description has been mainly given with respect to the case where the invention made by the present inventors is applied to the microprocessor as the field of utilization becoming the background of the invention, the present invention is not intended to be limited thereto, and hence it can also be generally utilized in the semiconductor IC in which the operation of a part of circuits is wanted to be stopped.

The merits or advantages offered from typical aspects or embodiments of the invention disclosed in the present specification are briefly described as follows.

That is, according to the present invention, since the supply of the power source voltage to a part of circuit blocks can be cut off with a signal right before the cutoff of the power source being stored, it is possible to reduce the power consumption while preventing the malfunction of the circuit blocks on the side of receiving the signal. In addition, since interface circuits are provided between the circuit blocks, the circuit blocks do not need to be changed and hence it is possible to reduce the power consumption on the basis of the small scale addition or change of a circuit(s). Further, the interface circuit is provided on a path of a signal outputted from a part of the circuit blocks for which the supply of the power source voltage(s) can be cut off to each of other circuit blocks and in the front of the position where the signal is branched, whereby it is possible to suppress the number of interface circuits to a minimum, which results in that it is possible to reduce the power consumption while suppressing the increase in circuit area.

It should be further understood by those skilled in the art that the foregoing description has been made on embodiments of the invention and that various changes and modifications may be made in the invention without departing from the spirit of the invention and the scope of the appended claims.

What is claimed is:

1. A semiconductor integrated circuit, including:

a plurality of circuit blocks, wherein a supply of power source voltage to at least one of said plurality of circuit blocks can be prevented to stop operation of said at least one circuit block, and at least one interblock interface circuit provided among said plurality of circuit blocks wherein said at least one interblock interface circuit comprises signal gate means for preventing transmission of a signal outputted from said at least one at said plurality of circuit blocks, and storage means for storing therein a state of said signal right before the preventing operation, wherein said at least one interblock interface circuit is formed in a semiconductor area electrically separated from a semiconductor substrate surface where elements constituting said plurality of circuit blocks are formed.

2. A semiconductor integrated circuit, including:

a plurality of circuit blocks, wherein a supply of power source voltage to at least one of said plurality of circuit blocks can be prevented to stop operation of said at least one circuit block, at least one interblock interface circuit provided among said plurality of circuit blocks for preventing transmission of a respective at least one corresponding block output signal, and a control circuit for controlling said least one interblock interface circuit, signal gate means for preventing said transmission of said signal outputted from said at least one of a plurality of circuit blocks, and storage means for storing therein a state of said signal right before the preventing operation.

3. A semiconductor integrated circuit according to claim 2 wherein said at least one interblock interface circuit is provided on a path of said at least one block output signal from said at least one circuit block to the rest of said plurality of circuit blocks and at a position before said signal is branched.

4. A semiconductor integrated circuit according to claim 2, wherein said at least one interblock interface circuit further includes signal comparison means for comparing said state of said signal stored by said storage means with a state of a signal supplied from said signal gate means turned on after restoration of the supply of the power source voltage to said at least one of said plurality of circuit blocks.

5. A semiconductor integrated circuit according to claim 2, wherein said control circuit controls turning off said signal gate means before preventing said supply of power source voltage to said at least one of said plurality of circuit blocks and for turning on said signal gate means after restoration of said supply of the power source voltage to said at least one of said plurality of circuit blocks.

6. A semiconductor integrated circuit according to claim 2, further comprising a power source switch for selecting any supply of power source voltage and for cutting off selected power source voltage from outside said at least one of said plurality of circuit blocks.

7. A semiconductor integrated circuit a cording to claim 6, wherein said power source switch is provided for cutting off said selected power source voltage by a control signal from said control circuit based on the signal from said at least one of said plurality of circuit blocks thereto.

* * * * *